United States Patent [19]

Murari et al.

[11] Patent Number: 5,031,023
[45] Date of Patent: Jul. 9, 1991

[54] SINGLE-IN-LINE PLASTIC PACKAGE WITH OPEN ENDED SLOTS FOR SLIDINGLY ACCOMMODATING FASTENERS' STEMS PREARRANGED ON AN EXTERNAL HEAT SINK

[75] Inventors: Bruno Murari, Monza; Giordano Seragnoli, Agrate Biranza, both of Italy

[73] Assignee: SGS-Thomson Microelectronics S.R.L., Italy

[21] Appl. No.: 548,710

[22] Filed: Jul. 6, 1990

[30] Foreign Application Priority Data

Jul. 11, 1989 [IT] Italy ................................ 83629 A/89

[51] Int. Cl.$^5$ ..................... H01L 23/36; H01L 23/40; H01L 23/12
[52] U.S. Cl. ....................................... 357/72; 357/81; 357/68
[58] Field of Search ................. 357/72, 74, 80, 79, 357/81, 68; 174/16.3, 52.4

[56] References Cited

U.S. PATENT DOCUMENTS

| 3,864,727 | 2/1975 | Schoberl | 357/68 |
| 4,095,253 | 6/1978 | Yoshimura et al. | 174/16.3 |
| 4,100,566 | 7/1978 | Okikawa et al. | 357/81 |
| 4,204,248 | 5/1980 | Proffit et al. | 357/81 |
| 4,387,413 | 7/1983 | Griffis | 361/386 |
| 4,636,580 | 1/1987 | Neidig et al. | 174/16.3 |
| 4,951,124 | 8/1990 | Sawaya | 357/74 |

FOREIGN PATENT DOCUMENTS 58-11355 7/1983 Japan .
2042803 9/1980 United Kingdom .

*Primary Examiner*—Rolf Hille
*Assistant Examiner*—S. V. Clark
*Attorney, Agent, or Firm*—Pollock, Vande Sande & Priddy

[57] ABSTRACT

A Single-In-Line molded resin package for a medium-power semiconductor device destined to receive an external heat sink mounted thereon is provided with one or more parallel open ended slots, perpendicular to the coupling face with the heat sink and open on the side of the package opposite to the side from which the pins projects.

The stems of the fastening screws which may be conveniently pre-arranged on the coupling face of the heat sink are slidingly received in the respective open ended slots or notches of the various devices aligned on the printed circuit card thus simplifying the assembly operations and making them more compatible to automation.

5 Claims, 1 Drawing Sheet

SINGLE-IN-LINE PLASTIC PACKAGE WITH OPEN ENDED SLOTS FOR SLIDINGLY ACCOMMODATING FASTENERS' STEMS PREARRANGED ON AN EXTERNAL HEAT SINK

BACKGROUND OF THE INVENTION

1. Field of the invention

The present invention relates to a molded plastic package for semiconductor devices of the so-called Single-In-Line (SIL) type to be associated with an external heat sink.

2. Description of the prior art

There are many known molded plastic packages for medium power semiconductor devices of the so-called Single-In-Line type which normally comprise a metal backing plate, often only partially embedded in the molded encapsulating plastic body and to which the semiconductor die encapsulated within the package is thermally connected. The die may be bonded directly on an internal surface of the metal backing plate, the opposite face of which remains exposed at least partially on a major surface of the encapsulating plastic body, which major surface forms a dihedral angle width and is normally perpendicular to a minor surface of the plastic body through which emerge the pins of the device. The generally polyhedric package is most commonly a flat parallelepiped, the major surface of which, where the surface of said partially embedded metal backing plate remains coplanarily exposed, is normally in contact with a flat coupling surface of an external heat sink, which is commonly a finned aluminum body. In order to ensure good heat conduction between the external heat sink and the device or the devices electrically connected through their plurality of pins to a printed circuit card, it is necessary to provide for mechanical fastening means between the devices and the external heat sink. These fasteners are generally screws, the stem of which passes through holes formed through the thickness of the flat package or of said metal backing plate onto which the encapsulating resin is molded.

Often the assembly of integrated devices and other circuit components on printed circuit cards and the execution of the tin soldering which is commonly carried out by the socalled wave-bath technique utilizes highly automated handling techniques of the various pieces which are incompatible with the presence of heavy and cumbersome metal heat sinks on the printed circuit cards. This makes it necessary to process the cards without the heat sinks which must be mounted later in a coupling relationship with generally a plurality of SIL devices which have been purposely mounted in a line on the card. The fact that the soldering of the pins of the devices on the card has already taken place and that departures from a perfect alignment between the fastening holes of the devices and the respective threaded holes pre-formed in the heat sink are inevitable, makes the assembly of the heat sink and the fastening thereof to the single devices difficult. These operations frequently must be carried out manually and the assembler must often cope with mismatchings among respective assembly holes. In other words the critical aspect is represented by the fact that the external heat sink has a plurality of threaded holes for the fastening screws of the devices which must be presented in a perfect alignment to the respective fastening holes of the devices which have already been soldered onto the printed circuit card. Moreover the various fastening screws must be singularly inserted and screwed in.

OBJECTIVE AND SUMMARY OF THE INVENTION

The present invention overcomes these problems and greatly simplifies the assembling of an external heat sink in a matching relationship with the different devices already mounted on a printed circuit card, making this operation more easily implementable by automatic means.

These objectives and related advantages are obtained by the improved Single-In-Line package for semiconductor devices object of the present invention.

Basically the package of the invention is provided with one or more open ended slots (or notches) parallel to each other, perpendicular to the coupling major face of the package which must be brought into an intimate contact with the surface of an external heat sink, formed in the side of the package which is opposite to the side through which the connecting pins emerge. Said single or multiple open ended slots formed in the same side of the package of different devices alignedly mounted on a printed circuit card are capable of slidingly receiving the stem of respective mechanical fasteners, e.g. screws, which may have previously been partially screwed in threaded holes pre-arranged on the coupling surface of the external heat sink. The heat sink with the device fastening screws already partially screwed in their respective holes, may then be brought near to or in abutment with the coupling faces of the different devices mounted on the printed circuit card and shifted thereon until the stems of the screws slide into the respective slots which open on the same side of the different devices. At this point only a final tightening of the various fastening screws is all that is required to complete the assembling.

It is evident that great simplification of the assembly operations is obtained in respect to the situation of the prior art wherein the fastening screws had to be individually inserted and screwed in the respective matching holes.

A slight longitudinal tapering of the open ended slots formed along the same side of the devices (i.e. the formation of "V" shaped notches) may be contemplated in order to further facilitate the assembling of the heat sink in consideration of slight deviations from a perfect alignment of the mounted devices in respect to the design geometrical arrangement also of the respective fastening screws partially pre-screwed in the threaded holes formed on the coupling surface of the metallic heat sink. This makes the heat sinks assembling operations even more compatible to be efficiently performed in an automatic mode by means of robots.

BRIEF DESCRIPTION OF THE DRAWINGS

The different aspects and peculiarities of the package of the invention will become more evident through the following detailed description of a preferred embodiment and by reference to the appended drawings, wherein.

DESCRIPTION OF PREFERRED EMBODIMENTS

Figure 1:
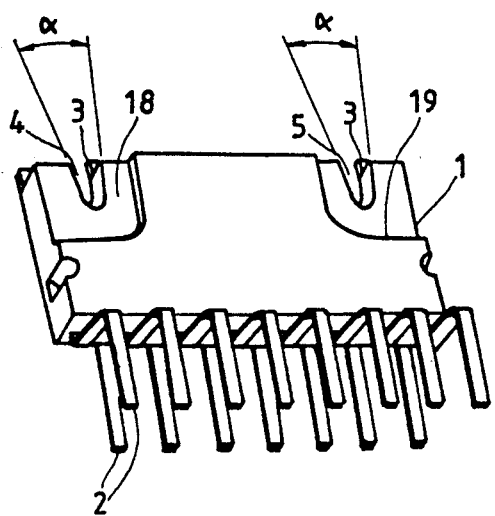
FIG. 1 shows a Single-In-Line device made in accordance with the present invention.

A Single-In-Line package made in accordance with the present invention is shown in FIG. 1. The package 1 has a flat, substantially parallelepiped form which determines the presence of two major faces and four minor or lateral faces or sides. All of the electrical connection pins of the device emerge from a single minor face of the container (Single-In-Line) all pins may be coplanar or more commonly, as in the case shown in FIG. 1, the pins are arranged in two parallel rows. The heat dissipation means is constituted by a backing metal plate 3, which may be placed on the bottom of the mold where the molding of the encapsulating epoxidic resin body 1 takes place so as to be permanently embedded in the molded resin body while remaining exposed through at least one major surface thereof. The backing metal plate 3 may be part of the assembly frame of the semiconductor die and may represent a lowered central pad thereof onto which the semiconductor die is bonded, while other radially extending portions of the metal frame which are patterned by die stamping, after final separation of bridging portions, becomes electrical connection pins of the device, the inner ends of which may be connected to the respective pads of the integrated circuit by means of welded wires. In this case, the central die assembly pad of the metal frame is lowered during the stamping thereof in respect to the remaining coplanar portions of the patterned metal frame and the so lowered bottom surface of the central pad of the metal frame will be the surface which will eventually remain coplanarily exposed on one of the two major surfaces of the molded package for establishing a good heat conduction path toward an external heat sink brought in contact thereto.

Alternatively the heat dissipating embedded metal element may be a separate plate from the assembly frame of the semiconductor die constituting a real backing plate over which the encapsulating resin body is molded.

Figure 2:
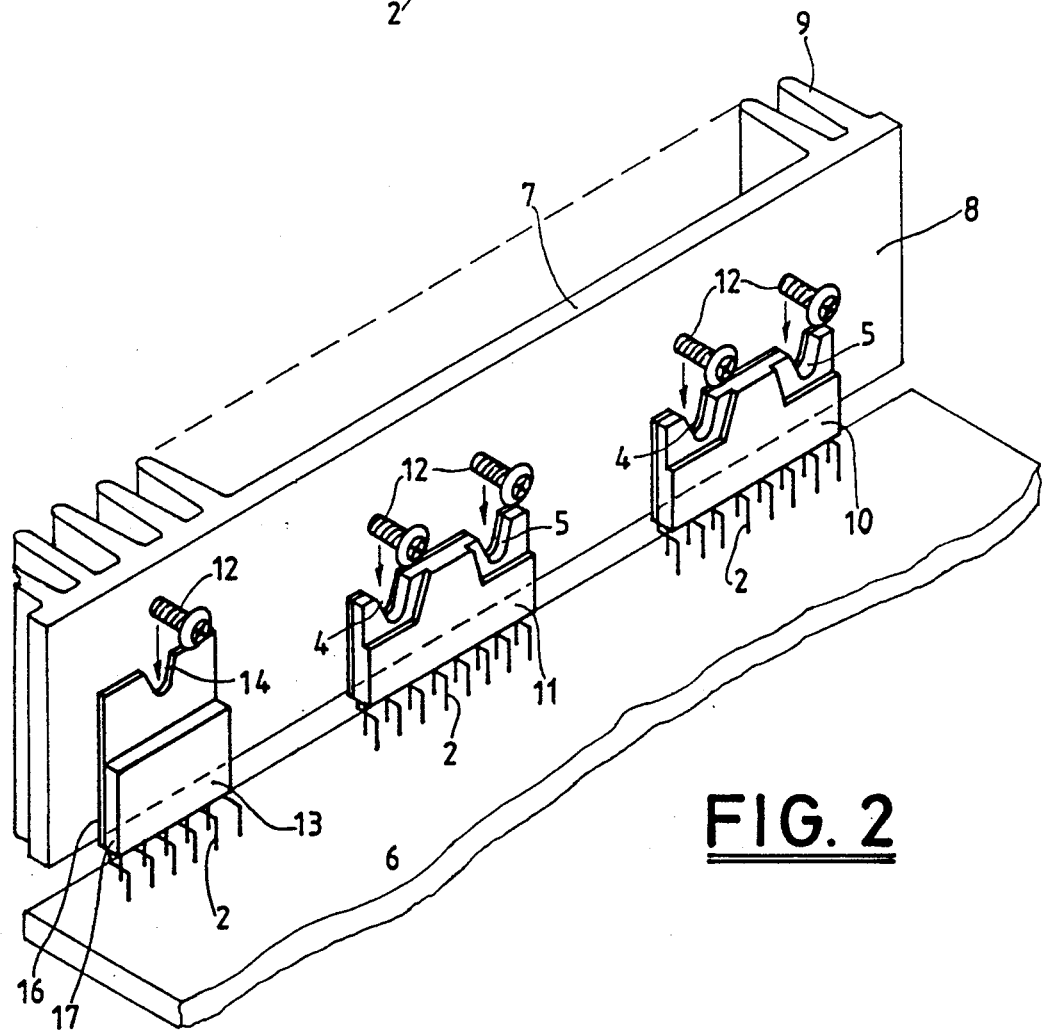
FIG. 2 schematically shows the manner by which an external heat sink may be mounted on the devices of the present invention assembled on a printed circuit card.

This metal backing plate may extend beyond the perimeter of the encapsulating molded resin body, from the side opposite to the side from which the pins emerge, by a sufficient distance in order to permit to form the open ended slots in accordance with the invention directly in this projecting portion of the metal backing plate 3, as in the case of the device 13 depicted in FIG. 2.

The package 1 is provided with two open ended slots or notches, respectively 4 and 5, parallel among each other and perpendicular to the major face of the parallelepiped body 1 to be coupled to an external heat sink and they are both open on the side of the package which is opposite to the side or minor face through which the electrical connection pins 2 emerge. The width of the two open ended slots 4 and 5 is sufficient to accommodate the stem of a mechanical fastening member, in a sliding manner through the open end of the slot. This may be better seen in FIG. 2.

Normally on a printed circuit card 6, a number of integrated devices and discrete components are mounted. In particular, medium heat-dissipation integrated circuits which require the assembly of an external heat sink 7, which is commonly formed by a metal body having a substantially flat coupling surface 8 and a finned portion 9, are normally mounted in a coplanar manner along one side of the card so as to be able to mount a single heat sink for all the aligned devices. In FIG. 2 two similar devices made in accordance with the present invention of the same type as that shown in FIG. 1 and a third device 13, also made in accordance with the present invention, but having a single open ended slot 14 formed in an extension portion 15 of a backing metal plate 16 of the encapsulating resin parallelepiped body 17 molded on the plate 16, are schematically shown.

As it may be observed, the assembling of the external heat sink 7 on the card 6, on which the soldering of the components have already been completed, may take place by bringing the coupling face 8 of the metal heat sink 7 near the back surface of the devices 10, 11 and 13 and lowering vertically (as shown by the arrows) the heat sink 7, until the stems of the fastening screws 12, which have been partially pre-screwed in the threaded holes pre-arranged in the heat sink body 7, slide in the open ended slots or notches 4, 5 and 14, open on the side of the devices opposite to the side from which emerge the pins 2. At this point it is sufficient to tighten the screws 12 on the surface of the resin package for completing the assembly.

According to a preferred embodiment, the open ended slots 4, 5 and 14 have sides which diverge slightly toward the open end of the slot, as shown in FIG. 1 by indicating the angle $\alpha$ of such a divergence, which angle may be comprised between 5° and 20°, in order to facilitate matching the plurality of stems of fastening screws with the respective "V" shaped accommodating seats formed in the packages of the devices mounted on the printed circuit card also in presence of minor departures from a perfect alignment which may intervene during the mounting and the soldering of the devices pins on the card.

Preferably the face of the resin package 1 onto which compressively acts the heads of the fastening screws 12 may be provided with suitable recesses 18 and 19 (FIG. 1) capable of accommodating the heads of the screws.

Of course the fact that a metal backing plate be present on the face of the molded package to be coupled to the external heat sink is not a necessary condition for the practice of the present invention. In some cases, e.g. for electrical insulating reasons, such a backing metal plate (e.g. the mounting frame of the semiconductor die) may be preferably completely encased in the resin and thus may not be exposed on the coupling face of the molded package.

What we claim is:

1. A molded resin package for a semiconductor device wherein all of the electrical connection pins of the device project from a first side of said package, said package having a second planar side forming substantially a dihedral angle with said first side and being destined to be thermally coupled to a flat coupling surface of a heat sink and means for mechanically fastening the packaged device to said heat sink, characterized by the fact that said fastening means comprise two spaced apart open ended slots, parallel to each other and perpendicularly to a third side of the package which is opposite to said first side, said open ended slots being capable of accommodating through the open end thereof through said opposite side of the package the stems of fastening screws partially pre-screwed in threaded holes pre-arranged on the coupling surface of said heat sink for mounting the latter on a plurality of said packaged devices, mounted in alignment on a printed circuit card, in an essentially sliding manner.

2. The package according to claim 1, wherein said slot open at one end have a "V" shape, the sides of the slot diverging toward the open end thereof by an angle comprised between 5° and 20°.

3. The package according to claim 1, wherein said fastening means are screws having a head which compressively acts on a surface of said package substantially opposite to said second side thereof.

4. The package according to claim 1, wherein a partially embedded metal backing plate onto which said resin is molded has a surface exposed coplanarily on said second side of the package for contacting said heat sink.

5. The package according to claim 4, wherein said metal backing plate extends from the perimeter of said molded resin package at least on said opposite side forming a projecting portion and said open ended slots are formed in said projecting portion of said backing metal plate of the package.

* * * * *